United States Patent
Bill

[11] Patent Number: 6,112,657
[45] Date of Patent: Sep. 5, 2000

[54] SQUEEGEE ATTACHMENT SYSTEM FOR A PRINTING MACHINE

[76] Inventor: Ralph J. Bill, 15640 Graham St., Huntington Beach, Calif. 92649

[21] Appl. No.: 09/377,536

[22] Filed: Aug. 19, 1999

[51] Int. Cl.⁷ .................................................. B41L 13/18
[52] U.S. Cl. ........................................... 101/123; 101/169
[58] Field of Search ................................. 101/114, 123, 101/124, 155, 157, 169; 15/245, 256.51, 256.53

[56] References Cited

U.S. PATENT DOCUMENTS

| | | | |
|---|---|---|---|
| 4,648,317 | 3/1987 | Bubley et al. | 101/123 |
| 4,940,354 | 7/1990 | Holderegger et al. | 101/169 |
| 4,989,512 | 2/1991 | Lindstrom et al. | 101/123 |
| 5,165,339 | 11/1992 | Hoffman et al. | 101/169 |
| 5,345,862 | 9/1994 | Giard | 101/123 |
| 5,533,445 | 7/1996 | Bill . | |

OTHER PUBLICATIONS

CSI, Double–Stroke Squeegee—Printwear Magazine Circle Reader Service No. 108—Aug. 1998 Issue p., 101, United States.

*Primary Examiner*—Ren Yan
*Attorney, Agent, or Firm*—James G. O'Neill

[57] ABSTRACT

An attachment system for a silk screen printer includes an elongated support bar having a pair of offset holding heads with aligned openings formed therein. A pair of elongated blade elements are slidably held in aligned openings in the offset holding heads, and include open areas for releasably supporting first and second spaced-apart and angled squeegees.

13 Claims, 3 Drawing Sheets

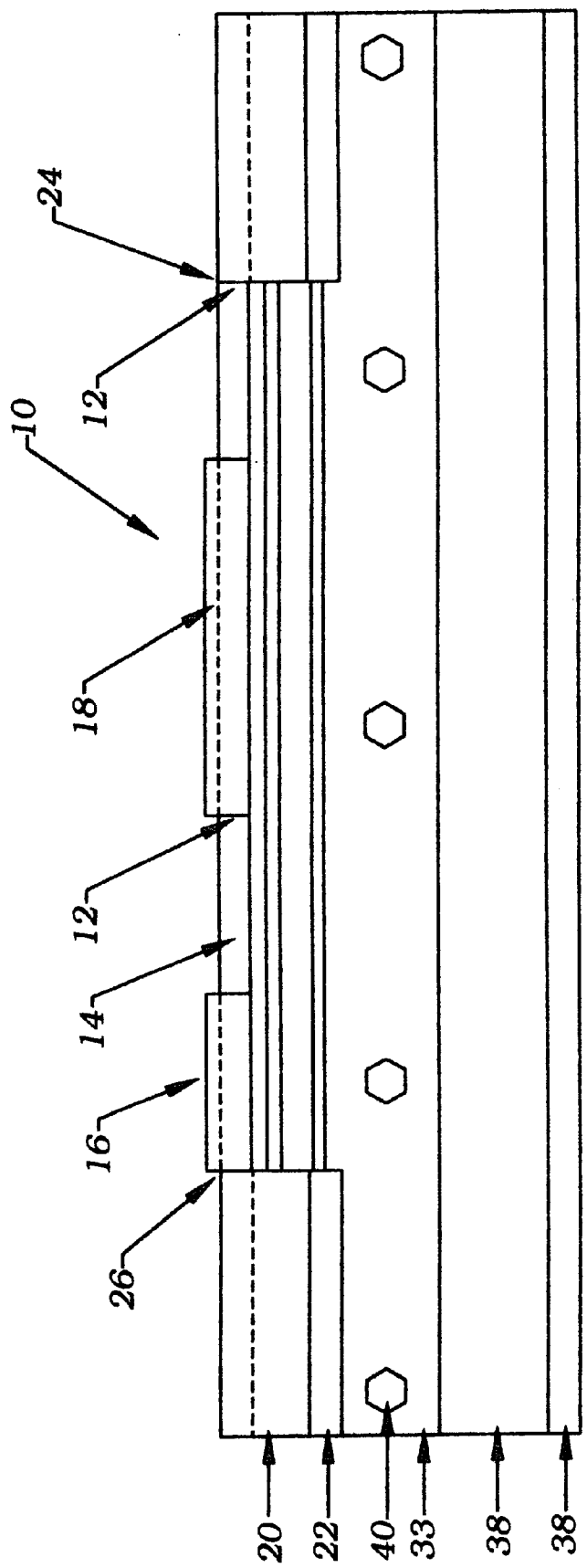

6,112,657

SQUEEGEE ATTACHMENT SYSTEM FOR A PRINTING MACHINE

BACKGROUND OF THE INVENTION

1. Field of the Invention

This invention relates generally to attaching systems, and more particularly, to an improved squeegee attachment system for a printing machine to improve the application of ink during a single stroke in a silk screening process.

2. Description of Prior Art

As is well known, many types of materials and products may be printed on utilizing what is referred to as stenciling or silk screening. Many printing applications, such as the silk screening of printed circuits, or intricate designs having a multiple of colors, require a high degree of precision in which the printing paste or ink has to be carefully spread and applied. Silk screen printing is well known in the industry, and may be done manually or by automated machines. The automated printing machines normally utilize one or more print heads each of which hold a single squeegee in place to press the ink or paste through the screen during a stroke. That is, in the automated machines, a print head assembly holding a squeegee is operatively associated for movement into and out of printing relationship with one or more pallets as the pallets are mechanically indexed and maintained in a horizontal plane as they pass the print head.

One known printing machine in which a silk screening may be used, is disclosed in U.S. Pat. No. 5,533,445 to Bill, issued on Jul. 9, 1996. FIGS. 5–7 of this patent shows an improved print head 13. A number of these improved print heads may be slidably mounted on cross bars 30, so as to be translatable into selected positions. A silk screen 32 is slidably supported in a channel or frame holder 34 secured below or underneath the print head 13. A printing squeegee 44 is removably and rotatably secured to a lower end of a rotatable face place 45 mounted to the front of the print head 13. Rotation of the front plate 45 will rotate or lower the printing squeegee 44 downwardly, toward the screen 32. This downward rotation occurs after a specifically shaped flood cycle, during which a specifically shaped flood bar 50 presses ink into the screen 32. During the printing cycle, the downwardly rotated printing squeegee 44 presses the spread ink through the screen onto the item being printed, as the squeegee is translated over the ink in the screen by movement of the print head 13. The flood bar or plate 50 is preferably formed so as to have angled side portions to sweep all ink toward the center, or inwardly, when moved across the screen during the flood cycle, before printing by the printing squeegee. This flood bar is preferably mounted to the print head 13 in a position, such as the front thereof, so as to produce the best operating results during the flood cycle or stroke.

Although this known machine produces improved results, multiple strokes are sometimes required to lay down sufficient ink. Therefore, there exists the need in the art for an improved squeegee attaching system, which allows an operator to utilize, interchangeably, a single squeegee or multiple spaced squeegees to eliminate multiple works, thereby decreasing cycle time and increasing throughput.

SUMMARY OF THE INVENTION

Accordingly, it is a general object of the present invention to provide an improved squeegee attaching system. It is a more particular object of the present invention to provide an improved squeegee attachment system for multiple squeegees. It is a further object of the present invention to provide an improved squeegee attachment system for holding, interchangeably, a single squeegee or multiple squeegees. It is yet a further object of the present invention to provide an improved squeegee attachment system, which allows multiple squeegees to be held in different, spaced-apart positions, depending on the size of the ink well, and/or to be easily replaced or reversed. It is still a further particular object of the present invention to provide an improved squeegee attachment system allowing multiple squeegees having different lengths or hardness for different jobs, to be held therein, and to be easily replaced or reversed.

In accordance with one embodiment of, the present invention there is provided a novel and unique squeegee attachment system for a printing machine having a plurality of elongated holding portions removably secured in offset holding heads secured to an elongated holding bar.

BRIEF DESCRIPTION OF THE DRAWINGS

The objects and features of the present invention which are believed to be novel, are set forth in particularity in the appended claims. The present invention, both as to its organization and manner of operation, together with further objectives and advantages, may best be understood by reference to the following description, taken in connection with the accompanying drawings, in which:

FIG. 1 is a front elevational view of a squeegee attachment system of the present invention;

DESCRIPTION OF THE PREFERRED EMBODIMENTS

The following description is provided to enable any person skilled in the art to make and use the invention and sets forth the best modes contemplated by the inventor of carrying out his invention. Various modifications, however, will remain readily apparent to those skilled in the art, since the generic principles of the present invention have been defined herein specifically to provide for a novel and improved squeegee attachment system, generally indicated at 10.

Figure 2A:
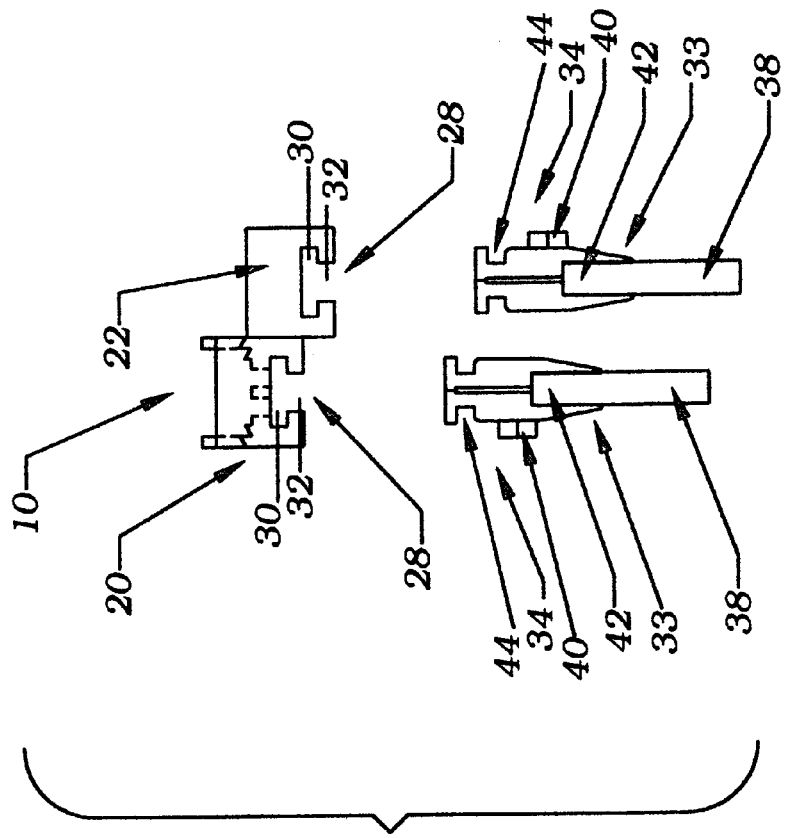
FIG. 2A is an exploded side elevational view of the squeegee attachment system of FIG. 1.
Figure 2:
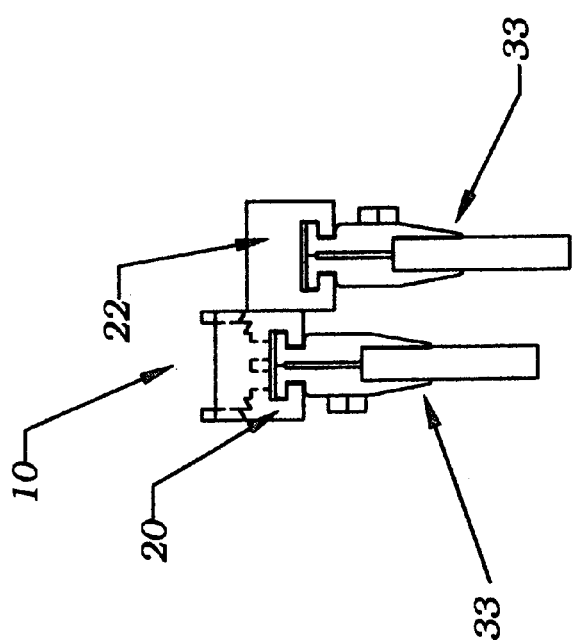
FIG. 2 is a side elevational view of FIG. 1.
Figure 3:
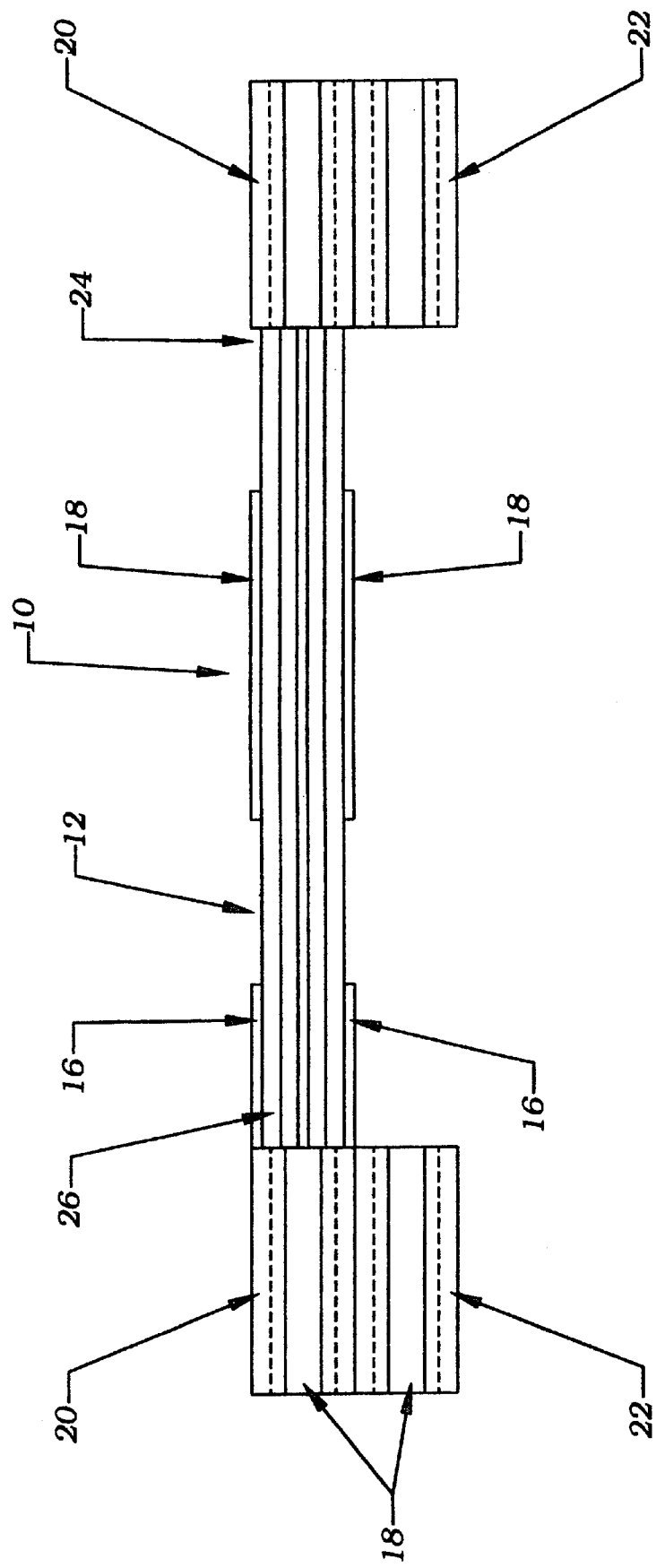
FIG. 3 is a bottom plan view of the squeegee attachment system of FIG. 1, with the squeegee removed.

Turning now to FIGS. 1–3 of the drawings, there shown is one embodiment of the novel attachment system 10 of the present invention, for use in a printing machine, not shown. The attachment system 10 will be held in a clamping or holding element in the print head, in a known manner, by openings 12 formed in a top bar or bracket 14, preferably made from metal, by plates 16, 18, secured to the bracket, as by being welded together, in a spaced relationship. A pair of offset holders, holding or supporting heads 20, 22 are secured to both ends 24, 26 of the bracket 14. The length of the bracket and the holding heads depends on the printing machine in which it is to be used, and may be of any standard length and/or width. Each of the holding or supporting heads 20, 22 includes a substantially identically T-shaped openings 28 formed therein. As best shown in FIG. 2A, the openings 28 are formed as open T's, and include an inner or upper rectangular open portion 30, and a lower open slot 32. Elongated blades or securing elements 33 are slid into and are captured in the open T's 28. The blades 33 are comprised of a pair of clamping elements 34 holding spaced squeegees 38, which may be of different lengths and/or hardness (durometer), held in openings 42. With the pairs of clamping elements of the elongated blades held together by securing elements 40, such as bolts, the top portions 44 thereof form T-shaped portions which are easily slid into and securely held by the openings 28 in the holding heads 20, 22. Upon releasing the securing elements 40, either when the elongated blades 33 are held in the T-shaped openings 28, or after the top portions 44 have been slid out of the T-shaped openings 28, the spaced-apart squeegees 38 may be easily changed or reversed, to provide a new fresh edge for further use. For example, the squeegees may have beveled, rounded or square edges, or be made from different materials, such as sandwiched, multiple-layered, different hardnesses of rubber. If only a single squeegee 38 is used, it is placed in a front position (direction of printing stroke) if a standard ink well is desired, or the rear position for a larger ink well. Two or more squeegees, spatially offset, may be used for different jobs.

It, therefore, can be seen that the attachment system of the present invention provides an integrated system having multiple squeegees spaced from each other a predetermined distance and angle, to allow items of any desired size, to be quickly and easily printed through a silk screen in a single stroke. This single stroke allows the multiple spaced and angled squeegees to more efficiently force the paste or ink through the silk screen.

Thus, there has been described an improved and simplified attachment system having integrated, spaced-apart holders for a single or multiple squeegees to allow items to be printed through a silk screen in a single stroke in a faster, more economical manner to meet today's market needs, while avoiding the wasting of pastes or inks, and requiring less time and equipment.

Those skilled in the art will appreciate that various adaptations and modifications of the just described preferred embodiment can be configured without departing from the scope and spirit of the invention. Therefore, it is to be understood that, within the scope of the appended claims, the invention may be practiced other than is specifically described herein.

What is claimed is:

1. An attachment system for a silk screen printer, comprising, in combination:

an elongated support bracket having a first end and a second end;

a first holding head and a second offset holding head secured to the first end;

a third holding head and a fourth offset holding head secured to the second end;

a shaped opening formed through the first holding head, the second offset holding head, the third holding head and the fourth offset holding head;

the shaped opening in the first holding head being aligned with the shaped opening in the third holding head;

a first elongated blade element removably held in the shaped opening in the first holding head and the shaped opening in the third holding head;

the shaped opening in the second offset holding head being aligned with the shaped opening in the fourth offset holding head;

a second elongated blade element removably held in the shaped opening in the second offset holding head and the shaped opening in the fourth offset holding head;

a first squeegee removably held in an opening formed in the first elongated blade element; and a second squeegee removably held in a further opening formed in the second elongated blade element.

2. The attachment system of claim 1 wherein each of shaped openings is formed in the shape of an open T, and the first elongated blade element and the second elongated blade element include top portions which are formed in the shape of a complementary T.

3. The attachment system of claim 2 where the first elongated blade element and the second elongated blade element are formed from complementary clamping portions, releasably held together.

4. The attachment system of claim 3 wherein the first squeegee and the second squeegee are reversible.

5. The attachment system of claim 4 wherein the second squeegee is straight.

6. An attachment system for a silk screen printer, comprising, in combination:

an elongated support bracket having a first end and a second end;

a first holding head and a second offset holding head secured to the first end;

a third holding head and a fourth offset holding head secured to the second end;

an elongated, shaped opening formed through the first holding head, the second offset holding head, the third holding head and the fourth offset holding head;

the elongated, shaped opening in the first holding head being aligned with the elongated shaped opening in the third holding head;

a first elongated securing element removably held in the elongated shaped opening in the first holding head and the elongated shaped opening in the third holding head;

the elongated shaped opening in the second offset holding head being aligned with the elongated shaped opening in the fourth offset holding head;

a second elongated securing element removably held in the elongated shaped opening in the second offset holding head and the elongated shaped opening in the fourth offset holding head;

a first squeegee removably held in an opening formed in the first elongated securing element; and a second squeegee removably held in a further opening formed in the second elongated securing element.

7. The attachment system of claim 6 wherein each of shaped openings is formed in the shape of an open T, and the first elongated securing element and the second elongated securing element include top portions which are formed in the shape of a complementary T.

8. The attachment system of claim 7 where the first elongated securing element and the second elongated securing element are made from complementary clamping portions, releasably held together.

9. The attachment system of claim 8 wherein the first squeegee and the second squeegee are reversible.

10. An attachment system for a silk screen printer, comprising, in combination:

an elongated metallic support bracket having a first end and a second end;

a first metallic holding head and a second offset metallic holding head secured to the first end;

a third metallic holding head and a fourth offset metallic holding head secured to the second end;

an elongated, T-shaped opening formed through the first metallic holding head, the second metallic offset holding head, the third metallic holding head and the fourth offset metallic holding head;

the elongated, T-shaped opening in the first metallic holding head being aligned with the elongated T-shaped opening in the third metallic holding head;

a first elongated blade element removably held in the elongated T-shaped opening in the first metallic holding head and the elongated T-shaped opening in the third metallic holding head;

the elongated T-shaped opening in the second offset metallic holding head being aligned with the elongated T-shaped opening in the fourth offset metallic holding head;

a second elongated blade element removably held in the elongated T-shaped opening in the second offset metallic holding head and the elongated T-shaped opening in the fourth offset metallic holding head;

a first squeegee removably held in an opening formed in the first elongated blade element; and a second squeegee removably held in a further opening formed in the second elongated blade element.

11. The attachment system of claim 10 wherein the first elongated blade and the second elongated blade are metallic, and include top portions which are formed in the shape of a T, which top portions are slidably held in the elongated T-shaped opening in each aligned metallic holding head.

12. The attachment system of claim 10 where the first elongated blade element and the second elongated blade element are made from complementary clamping portions, releasably held together.

13. The attachment system of claim 12 wherein the first squeegee and the second squeegee are reversible.

* * * * *